(12) United States Patent
Yuan et al.

(10) Patent No.: US 11,012,274 B2
(45) Date of Patent: May 18, 2021

(54) DEMULTIPLEXER AND METHOD OF CONTROLLING THE SAME, AND DISPLAY DEVICE

(71) Applicant: BOE TECHNOLOGY GROUP CO., LTD., Beijing (CN)

(72) Inventors: Lijun Yuan, Beijing (CN); Haoliang Zheng, Beijing (CN); Guangliang Shang, Beijing (CN); Xing Yao, Beijing (CN); Mingfu Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 145 days.

(21) Appl. No.: 16/414,478

(22) Filed: May 16, 2019

(65) Prior Publication Data

US 2019/0356523 A1  Nov. 21, 2019

(30) Foreign Application Priority Data

May 17, 2018  (CN) .......................... 201810486758.9

(51) Int. Cl.
*H04L 27/26* (2006.01)
*H03D 1/22* (2006.01)

(52) U.S. Cl.
CPC ....... *H04L 27/2601* (2013.01); *H03D 1/2209* (2013.01)

(58) Field of Classification Search
CPC ......... G09G 2310/0297; G09G 3/3688; G09G 3/3648; G09G 2330/021; H04L 27/2601; H03D 1/2209
See application file for complete search history.

(56) References Cited

U.S. PATENT DOCUMENTS

2016/0293093 A1* 10/2016 Seo ........................... G09G 3/20

* cited by examiner

*Primary Examiner* — William Boddie
*Assistant Examiner* — Jeffrey Parker
(74) *Attorney, Agent, or Firm* — McDermott Will & Emery LLP

(57) ABSTRACT

A demultiplexer includes a voltage boost circuit and at least one data selection output circuit. The voltage boost circuit is coupled to N second-stage selection signal input terminals and N first-stage selection signal input terminals, N is greater than or equal to 2, and N is a positive integer. Each data selection output circuit is coupled to a data input terminal, N data output terminals and the N first-stage selection signal input terminals.

14 Claims, 6 Drawing Sheets

DEMULTIPLEXER AND METHOD OF CONTROLLING THE SAME, AND DISPLAY DEVICE

CROSS-REFERENCE TO RELATED APPLICATION

This application claims priority to Chinese Patent Application No. 201810486758.9, filed with the Chinese Patent Office on May 17, 2018, titled "DEMULTIPLEXER AND METHOD OF CONTROLLING THE SAME, AND DISPLAY DEVICE", which is incorporated herein by reference in its entirety.

TECHNICAL FIELD

The present disclosure relates to the field of display technologies, and in particular, to a demultiplexer and a method of controlling the same, and a display device.

BACKGROUND

A demultiplexer (abbreviated as DMUX), also known as a data distributor or a multiplex demodulator, is a logic circuit that transmits an input signal to a specified output terminal based on different states of input address codes. Currently, the demultiplexer is widely used in various fields, such as the field of display technologies.

SUMMARY

In a first aspect, a demultiplexer is provided. The demultiplexer includes a voltage boost circuit and at least one data selection output circuit. The voltage boost circuit is coupled to N second-stage selection signal input terminals and N first-stage selection signal input terminals. The N second-stage selection signal input terminals are in one-to-one correspondence with the N first-stage selection signal input terminals. The voltage boost circuit is configured to successively boost voltages input via the N second-stage selection signal input terminals and output the boosted voltages to corresponding first-stage selection signal input terminals. N is greater than or equal to 2, and N is a positive integer. Each data selection output circuit is coupled to a data input terminal, N data output terminals and the N first-stage selection signal input terminals. The data selection output circuit is configured to successively output data signals from the data input terminal to the N data output terminals under control of the N first-stage selection signal input terminals.

In some embodiments, the voltage boost circuit includes N voltage boost sub-circuits. Each voltage boost sub-circuit is coupled to a corresponding first-stage selection signal input terminal and a corresponding second-stage selection signal input terminal. A (K−1)th voltage boost sub-circuit is further configured to reset a voltage on a (K−1)th first-stage selection signal input terminal when a Kth voltage boost sub-circuit boosts a voltage input via a Kth second-stage selection signal input terminal. K is greater than or equal to 2 and is less than or equal to N, and K is a positive integer.

In some embodiments, each voltage boost sub-circuit includes a coupling capacitor and a reset module. A first electrode of the coupling capacitor is coupled to a corresponding second-stage selection signal input terminal, a second electrode of the coupling capacitor is coupled to an auxiliary signal input terminal and a corresponding first-stage selection signal input terminal. The coupling capacitor is configured to add a voltage input via the second-stage selection signal input terminal to a voltage input via the auxiliary signal input terminal and output an added voltage to the first-stage selection signal input terminal. The reset module is coupled to the first-stage selection signal input terminal, a control signal input terminal and a first voltage terminal. The reset module is configured to transmit a voltage signal input via the first voltage terminal to the first-stage selection signal input terminal under control of a voltage input via the control signal input terminal, so as to reset a voltage on the first-stage selection signal input terminal.

In some embodiments, the reset module includes a first thin film transistor. A control electrode of the first thin film transistor is coupled to the control signal input terminal, a first electrode of the first thin film transistor is coupled to the first-stage selection signal input terminal, and a second electrode of the first thin film transistor is coupled to the first voltage terminal.

In some embodiments, each voltage boost sub-circuit further includes an input module coupled to the auxiliary signal input terminal and the coupling capacitor. The input module is configured to transmit the voltage input via the auxiliary signal input terminal to the second electrode of the coupling capacitor.

In some embodiments, the input module includes a second thin film transistor. A control electrode and a first electrode of the second thin film transistor are coupled to the auxiliary signal input terminal, and a second electrode of the second thin film transistor is coupled to the second electrode of the coupling capacitor.

In some embodiments, the demultiplexer further includes control signal input terminals and second-stage selection signal input terminals. A (K−1)th control signal input terminal is coupled to the Kth second-stage selection signal input terminal. The (K−1)th control signal input terminal is a control signal input terminal coupled to a reset module in the (K−1)th voltage boost sub-circuit, and the Kth second-stage selection signal input terminal is a second-stage selection signal input terminal coupled to a coupling capacitor in the Kth voltage boost sub-circuit. An Nth control signal input terminal is coupled to a first second-stage selection signal input terminal. The Nth control signal input terminal is a control signal input terminal coupled to a reset module of an Nth voltage boost sub-circuit, and the first second-stage selection signal input terminal is a second-stage selection signal input terminal coupled to a coupling capacitor in a first voltage boost sub-circuit.

In some embodiments, each voltage boost sub-circuit further includes an input module coupled to the auxiliary signal input terminal and the coupling capacitor. The demultiplexer further includes auxiliary signal input terminals. A (K−1)th second-stage selection signal input terminal is coupled to a Kth auxiliary signal input terminal. The (K−1)th second-stage selection signal input terminal is a second-stage selection signal input terminal coupled to a coupling capacitor in the (K−1)th voltage boost sub-circuit, and the Kth auxiliary signal input terminal is an auxiliary signal input terminal coupled to an input module in the Kth voltage boost sub-circuit. An Nth second-stage selection signal input terminal is coupled to a first auxiliary signal input terminal. The Nth second-stage selection signal input terminal is a second-stage selection signal input terminal coupled to a coupling capacitor in the Nth voltage boost sub-circuit, and the first auxiliary signal input terminal is an auxiliary signal input terminal coupled to an input module in the first voltage boost sub-circuit.

In some embodiments, each data selection output circuit includes N control switches electrically connected to the data input terminal. Each control switch is coupled to a first-stage selection signal input terminal and a data output terminal. Each control switch is configured to transmit a data signal from the data input terminal to the data output terminal coupled thereto under control of the first-stage selection signal input terminal coupled thereto.

In some embodiments, each control switch includes a third thin film transistor. A control electrode of the third thin film transistor is coupled to a corresponding first-stage selection signal input terminal, a first electrode of the third thin film transistor is coupled to the data input terminal, and a second electrode of the third thin film transistor is coupled to the data output terminal.

In some embodiments, the third thin film transistor is an N-type thin film transistor.

In a second aspect, a display device is provided. The display device includes a plurality of data lines and the demultiplexer according to the first aspect. A data output terminal coupled to the demultiplexer is coupled to a data line.

In some embodiments, the display device further includes a plurality of pixels. Each pixel includes N sub-pixels. Each pixel corresponds to a data selection output circuit of the demultiplexer, and the N sub-pixels in each pixel are coupled to a corresponding data selection output circuit through N data lines coupled one-to-one to data output terminals.

In a third aspect, a method of controlling the demultiplexer according to the first aspect is provided. The method of controlling the demultiplexer includes: in a pre-charge period, inputting a first voltage signal to an auxiliary signal input terminal coupled to a voltage boost sub-circuit, so as to write the first voltage signal to a coupling capacitor in the voltage boost sub-circuit; in a voltage boost period, inputting a second voltage signal to a second-stage selection signal input terminal coupled to the coupling capacitor, and writing, by the coupling capacitor, a third voltage signal obtained by adding the first voltage signal to the second voltage signal to a first-stage selection signal input terminal coupled thereto; and in a reset period, inputting a fourth voltage signal to a control signal input terminal coupled to the voltage boost sub-circuit, and writing, by a reset module in the voltage boost sub-circuit, a voltage signal from a first voltage terminal to the first-stage selection signal input terminal under control of the fourth voltage signal, so as to reset a voltage on the first-stage selection signal input terminal.

In some embodiments, the method of controlling the demultiplexer further includes: in a pre-reset period, stopping inputting the second voltage signal to the second-stage selection signal input terminal, wherein the pre-reset period is after the voltage boost period and before the reset period.

In some embodiments, the method of controlling the demultiplexer further includes: in the voltage boost period, outputting, by data selection output circuits coupled to the voltage boost sub-circuit, data signals from data input terminals to data output terminals respectively under control of the first-stage selection signal input terminal.

In some embodiments, first voltage signals are cyclically input via N auxiliary signal input terminals coupled to N voltage boost sub-circuits. When a previous voltage boost sub-circuit is at a beginning of the voltage boost period, a current voltage boost sub-circuit is at a beginning of the pre-charge period. When the previous voltage boost sub-circuit is at a beginning of the reset period, the current voltage boost sub-circuit is at the beginning of the voltage boost period.

In a fourth aspect, a non-transitory computer-readable storage medium is provided. The non-transitory computer-readable storage medium stores executable instructions that, when executed by a display device, cause the display device to perform the control method according to the third aspect.

BRIEF DESCRIPTION OF THE DRAWINGS

In order to describe technical solutions in embodiments of the present disclosure more clearly, the accompanying drawings to be used in the description of disclosure will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solutions in some embodiments of the present disclosure will be described clearly and completely with reference to the accompanying drawings in some embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In a display panel of a display device, a demultiplexer is usually disposed on a chip on film (abbreviated as COF)

disposed in a bonding region, so as to use the demultiplexer to successively transmit data voltages on at least one data input terminal to a corresponding plurality of data lines, thereby reducing the number of data input terminals, and achieving a narrow bezel of the display device. For example, with reference to FIG. 1, the demultiplexer 10 is coupled to two data input terminals ($V_{Data0}$ and $V_{Data1}$). The demultiplexer 10 may successively transmit data voltages on the data input terminal $V_{Data0}$ to corresponding data lines $D_1$, $D_2$ and $D_3$ under control of selection signals (input signals from $SW_1$, $SW_2$ and $SW_3$), or, may successively transmit data voltages on the data input terminal $V_{Data1}$ to corresponding data lines $D_4$, $D_5$ and $D_6$ under control of the selection signals.

Figure 1:
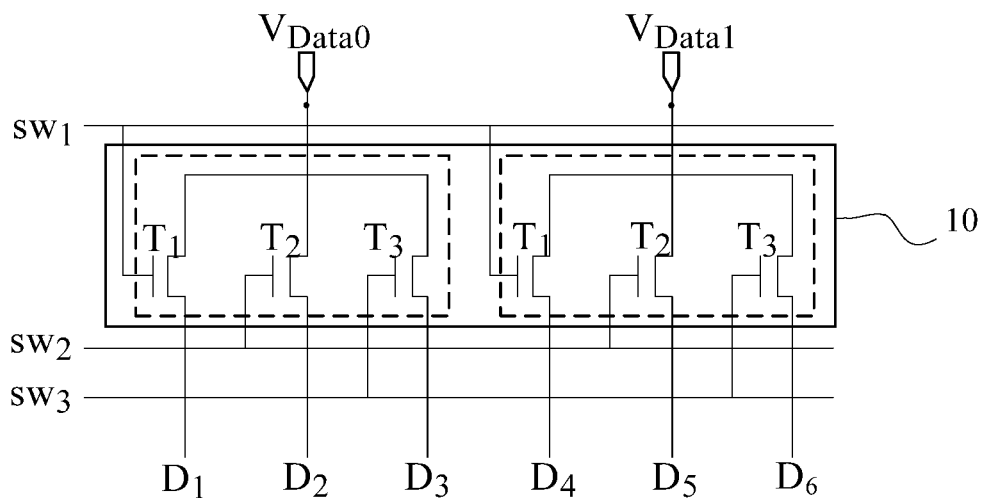
FIG. 1 is a schematic circuit diagram of a demultiplexer in the related art.

With continued reference to FIG. 1, the demultiplexer 10 in the related art includes a plurality of control switches, each of which is, for example, a thin film transistor (abbreviated as TFT). Since manufacturing processes of oxide thin film transistors are less difficult than manufacturing processes of amorphous silicon (α-Si) thin film transistors and low-temperature polysilicon (abbreviated as LTPS) thin film transistors, which makes it easy to manufacture the oxide thin film transistors in the COF, and a manufacturing cost of the oxide thin film transistors is lower, thin film transistors of the demultiplexer 10 are usually oxide thin film transistors.

Figure 2:
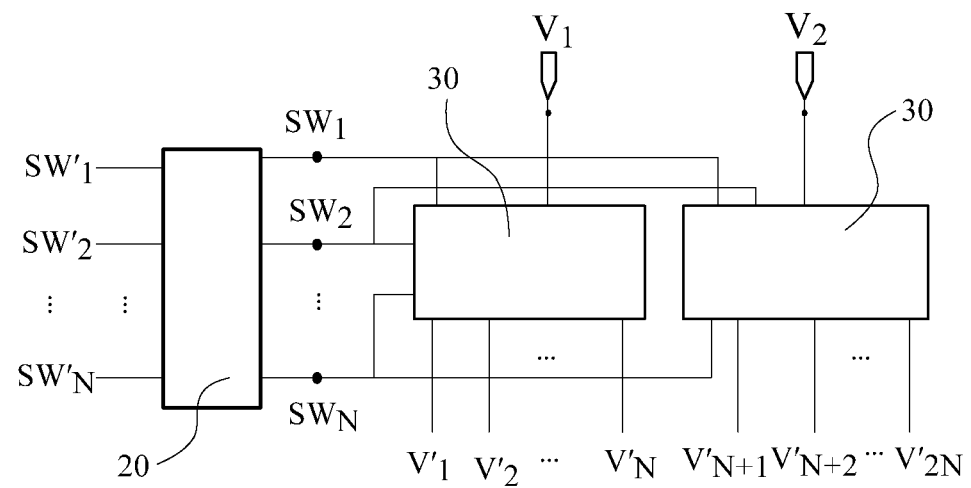
FIG. 2 is a schematic circuit diagram of a demultiplexer, in accordance some embodiments of the present disclosure.

Some embodiments of the present disclosure provide a demultiplexer 10. With reference to FIG. 2, the demultiplexer 10 is configured to selectively transmit data signals input via at least one data input terminal V to corresponding data output terminals V'. The demultiplexer 10 includes a voltage boost circuit 20 and at least one data selection output circuit 30 (FIG. 2 shows an example in which the at least one data selection output circuit 30 includes two data selection output circuits 30).

The voltage boost circuit 20 is coupled to N second-stage selection signal input terminals SW' and N first-stage selection signal input terminals SW, N is greater than or equal to 2, and N is a positive integer. The N second-stage selection signal input terminals SW' are in one-to-one correspondence with the N first-stage selection signal input terminals SW, and the voltage boost circuit 20 is configured to successively boost voltages input via the N second-stage selection signal input terminals SW' and output the boosted voltages to corresponding first-stage selection signal input terminals SW.

Each data selection output circuit 30 is coupled to a data input terminal V, N data output terminals V' and the N first-stage selection signal input terminals SW. The data selection output circuit 30 is configured to successively transmit data signals from the data input terminal V to the N data output terminals V' under control of the N first-stage selection signal input terminals SW.

The number of the at least one data selection output circuit 30 included in the demultiplexer 10 may be selectively set according to actual needs. For example, the number of the at least one data selection output circuit 30 included in the demultiplexer 10 is set according to the number of the at least one data input terminal V. For example, one data input terminal V is coupled to one data selection output circuit 30.

Moreover, the number N of the data output terminals V' coupled to each data selection output circuit 30 may also be selectively set according to actual needs. In some examples, one data selection output circuit 30 is coupled to two data output terminals V' to successively transmit data signals from the data input terminal V to the two data output terminals V'. In some other examples, one data selection output circuit 30 is coupled to three data output terminals V' to successively transmit data signals from the data input terminal V to the three data output terminals V'. In some other examples, one data selection output circuit 30 is coupled to four data output terminals V' to successively transmit data signals from the data input terminal V to the four data output terminals V'.

In some embodiments, with reference to FIG. 2, the demultiplexer 10 includes a plurality of data selection output circuits 30, and the plurality of data selection output circuits 30 share the N first-stage selection signal input terminals SW. That is, the N first-stage selection signal input terminals SW are coupled to each data selection output circuit 30.

In addition, the demultiplexer 10 is configured to transmit signals to data lines of a display panel. For example, each data selection output circuit 30 of the demultiplexer 10 receives gate voltages successively input via the N first-stage selection signal input terminals SW coupled thereto, and then successively transmits the data signals from the corresponding data input terminal V to corresponding N data output terminals V' under the control of the gate voltages from the N first-stage selection signal input terminals SW, thereby transmitting the data signals to data lines coupled one-to-one to the N data output terminals V'.

Here, each first-stage selection signal input terminal SW and each second-stage selection signal input terminal SW' are configured to respectively input constant voltages (including a voltage of 0V) or pulse voltages, and each pulse voltage includes a high level signal (for example, a positive level signal) and a low level signal (for example, a negative level signal).

In some embodiments, pulse voltages are input via the first-stage selection signal input terminals SW and the second-stage selection signal input terminals SW' respectively, and whether or not the level signals of the pulse voltages are valid depends on a type of thin film transistors used in the data selection output circuit 30. In some examples, the thin film transistors in the data selection output circuit 30 are N-type thin film transistors, and the high level signals in the pulse voltages input via the first-stage selection signal input terminals SW and the second-stage selection signal input terminals SW' are valid. For example, a voltage of the high level signal of the pulse voltage is 15V, a voltage of the low level signal of the pulse voltage is 0V, and a voltage of an effective level signal of the pulse voltage is 15V, which is regarded as a voltage input via the first-stage selection signal input terminals SW or the second-stage selection signal input terminals SW'. In some other examples, the thin film transistors in the data selection output circuit 30 are P-type thin film transistors, and the low level signals of the pulse voltages input via the first-stage selection signal input terminals SW and the second-stage selection signal input terminals SW' are valid. For example, a voltage of the high level signal of the pulse voltage is 0V, a voltage of the low level signal of the pulse voltage is −15V, and the effective level signal of the pulse voltage is −15V, which is regarded as the voltage input via the first-stage selection signal input terminals SW or the second-stage selection signal input terminals SW'.

In some embodiments, the voltage boost circuit 20 is configured to successively boost the voltages input via the N second-stage selection signal input terminals SW' and output the boosted voltages to the corresponding first-stage selection signal input terminals SW. In this regard, it will be understood by a person skilled in the art that when a voltage input via a second-stage selection signal input terminal SW' is boosted, a previous boosted voltage (referring to a boosted voltage obtained by boosting a voltage input via another second-stage selection signal input terminal SW') input to another first-stage selection signal input terminal SW is required to be reset back to an initial voltage. That is, only one of the N first-stage selection signal input terminals SW has a boosted voltage thereon at the same time, which is obtained by boosting a voltage input via a corresponding second-stage selection signal input terminal SW'.

For example, voltages are successively input via a first second-stage selection signal input terminal SW'$_1$ and a second second-stage selection signal input terminal SW'$_2$. In response to receiving the voltage input via the first second-stage selection signal input terminal SW'$_1$, the voltage boost circuit 20 boosts the voltage input via the first second-stage selection signal input terminal SW'$_1$ and outputs a boosted voltage to a corresponding first first-stage selection signal input terminal SW$_1$. In response to receiving the voltage input via the second second-stage selection signal input terminal SW'$_2$, the voltage boost circuit 20 boosts the voltage input via the second second-stage selection signal input terminal SW'$_2$ and outputs a boosted voltage to a corresponding second first-stage selection signal input terminal SW$_2$. When the voltage boost circuit 20 boosts the voltage input via the second second-stage selection signal input terminal SW'$_2$, the voltage boost circuit 20 resets the voltage on the first first-stage selection signal input terminal SW$_1$. In this way, it may be avoided that the voltage on the first first-stage selection signal input terminal SW$_1$ and a voltage on the second first-stage selection signal input terminal SW$_2$ are simultaneously effective voltages. That is, it may be avoided that a data selection output circuit 30 simultaneously outputs the data signals from the data input terminal V to two data output terminals V' under control of the first first-stage selection signal input terminal SW$_1$ and the second first-stage selection signal input terminal SW$_2$.

Correspondingly, a data signal from a data input terminal V is transmitted to only one data output terminal V' at a time. Therefore, when a voltage input via a second-stage selection signal input terminal SW' is boosted, a first-stage selection signal input terminal SW corresponding to a previous second-stage selection signal input terminal SW' is reset.

Some embodiments of the present disclosure do not limit a structure of the voltage boost circuit 20, as long as a voltage output to each first-stage selection signal input terminal SW after passing through the voltage boost circuit 20 is greater than a voltage input via a corresponding second-stage selection signal input terminal SW'. In some examples, the voltage boost circuit 20 includes a voltage amplifier circuit. Thus, a voltage input via each second-stage selection signal input terminal SW' is amplified by the voltage amplifier circuit, so that a voltage output to each first-stage selection signal input terminal SW is greater than a voltage initially input via a corresponding second-stage selection signal input terminal SW'. In some other examples, the voltage boost circuit 20 includes a voltage superimposing circuit, and the voltage superimposing circuit is configured to add a voltage to the voltage input via each second-stage selection signal input terminal SW', so that a voltage output to each first-stage selection signal input terminal SW is greater than a voltage initially input via a corresponding second-stage selection signal input terminal SW'.

In the demultiplexer 10 provided by the embodiments, by using the voltage boost circuit 20, the input voltages on the first-stage selection signal input terminals SW may be effectively enhanced, that is, the gate voltages are increased, so that the data selection output circuit 30 has a greater capability of outputting the data signal. That is, in a case where the data selection output circuit 30 includes at least one oxide thin film transistor (for example, at least one N-type thin film transistor), a voltage on a control electrode of each oxide thin film transistor is made larger to ensure a larger electron mobility of the oxide thin film transistor, thereby ensuring the charging capability of the oxide thin film transistor. Further, in a case where the demultiplexer 10 is applied to a display device and transmits a voltage on the data input terminal V to a plurality of data lines, since the charging capability of each oxide thin film transistor in the data selection output circuit 30 is ensured, the values of data voltages transmitted to the corresponding data lines from each data input terminal V through the demultiplexer 10 have a larger range and an higher accuracy.

Figure 3:
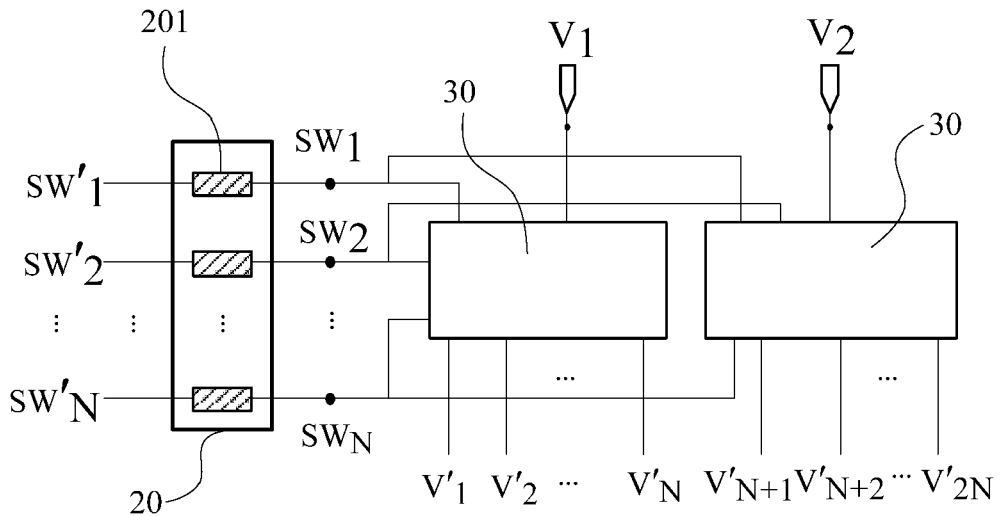
FIG. 3 is a schematic circuit diagram of another demultiplexer, in accordance some embodiments of the present disclosure.

In some embodiments, with reference to FIG. 3, the voltage boost circuit 20 includes N voltage boost sub-circuits 201. Each voltage boost sub-circuit 201 is coupled to a first-stage selection signal input terminal SW and a second-stage selection signal input terminal SW'. A (K–1)th voltage boost sub-circuit 201 is further configured to reset a voltage on a (K–1)th first-stage selection signal input terminal SW$_{K-1}$ when a Kth voltage boost sub-circuit 201 boosts a voltage input via a Kth second-stage selection signal input terminal SW'$_K$. K is greater than or equal to 2 and is less than or equal to N, and K is a positive integer. Here, voltages are successively input via the N second-stage selection signal input terminals SW' (or the N first-stage selection signal input terminals SW), and according to a sequence of inputting the voltages via the N second-stage selection signal input terminals SW', there is also a sequence of boosting, by the N voltage boost sub-circuits 201, the voltages input via the second-stage selection signal input terminals SW' coupled thereto. A voltage boost sub-circuit 201 coupled to a second-stage selection signal input terminal SW' via which a voltage is first input is regarded as a previous voltage boost sub-circuit 201, and a voltage boost sub-circuit 201 coupled to a second-stage selection signal input terminal SW' via which a voltage is later input is regarded as a latter voltage boost sub-circuit 201.

That is, the (K–1)th voltage boost sub-circuit 201 is a previous voltage boost sub-circuit of the Kth voltage boost sub-circuit 201. When the voltage input via the Kth second-stage selection signal input terminal SW'$_K$ is boosted by the Kth voltage boost sub-circuit 201, the (K–1)th voltage boost sub-circuit 201 has completed boosting a voltage input via a (K–1)th second-stage selection signal input terminal SW'$_{K-1}$ and the boosted voltage has been output to the (K–1)th first-stage selection signal input terminal SW$_{K-1}$, and the voltage on the (K–1)th first-stage selection signal input terminal SW$_{K-1}$ is reset back to an initial state under an action of the (K–1)th voltage boost sub-circuit 201.

Of course, in a case where the N voltage boost sub-circuits 201 cyclically boost voltages input via corresponding second-stage selection signal input terminals SW', an Nth voltage boost sub-circuit 201 is a previous voltage boost sub-circuit of a first voltage boost sub-circuit 201. Therefore, when the voltage input via the first second-stage selection signal input terminal SW'$_1$ is boosted by the first voltage boost sub-circuit 201, the Nth voltage boost sub-circuit 201 has completed boosting a voltage input via an Nth second-stage selection signal input terminal SW'$_N$ and the boosted voltage has been output to an Nth first-stage selection signal input terminal SW$_N$, and a voltage on the Nth first-stage selection signal input terminal SW$_N$ is reset back to an initial state under an action of the Nth voltage boost sub-circuit 201.

For example, the voltage boost circuit 20 includes three voltage boost sub-circuits 201, which are a first voltage boost sub-circuit 201, a second voltage boost sub-circuit 201 and a third voltage boost sub-circuit 201, respectively. The first voltage boost sub-circuit 201 is coupled to the first second-stage selection signal input terminal SW'$_1$ and the first first-stage selection signal input terminal SW$_1$, the second voltage boost sub-circuit 201 is coupled to a second second-stage selection signal input terminal SW'$_2$ and a second first-stage selection signal input terminal SW$_2$, and the third voltage boost sub-circuit 201 is coupled to a third second-stage selection signal input terminal SW'$_3$ and a third first-stage selection signal input terminal SW$_3$. If voltages are successively and cyclically input via the first second-stage selection signal input terminal SW'$_1$, the second second-stage selection signal input terminal SW'$_2$ and the third second-stage selection signal input terminal SW'$_3$, a previous voltage boost sub-circuit 201 of the second voltage boost sub-circuit 201 is the first voltage boost sub-circuit 201, and a latter voltage boost sub-circuit 201 of the second voltage boost sub-circuit 201 is the third voltage boost sub-circuit 201. A previous voltage boost sub-circuit 201 of the third voltage boost sub-circuit 201 is the second voltage boost sub-circuit 201, and a latter voltage boost sub-circuit 201 of the third voltage boost sub-circuit 201 is the first voltage boost sub-circuit 201. A previous voltage boost sub-circuit 201 of the first voltage boost sub-circuit 201 is the third voltage boost sub-circuit 201, and a latter voltage boost sub-circuit 201 of the first voltage boost sub-circuit 201 is the second voltage boost sub-circuit 201.

Since each voltage boost sub-circuit 201 is coupled to a first-stage selection signal input terminal SW and a second-stage selection signal input terminal SW', each voltage boost sub-circuit 201 may boost the voltage input via the second-stage selection signal input terminal SW', and may output the boosted voltage to the first-stage selection signal input terminal SW. Moreover, since when a voltage boost sub-circuit 201 boosts a voltage input via a corresponding second-stage selection signal input terminal SW', a previous voltage boost sub-circuit 201 resets a voltage on a first-stage selection signal input terminal SW coupled thereto, only one first-stage selection signal input terminal SW has a boosted voltage thereon at the same time, and other first-stage selection signal input terminals SW are in the reset state, thereby the data signal from the data input terminal V may be only transmitted to a data output terminal V' corresponding to the first-stage selection signal input terminal SW via which the boosted voltage is input.

Each voltage boost sub-circuits 201 in some embodiments of the present disclosure independently works, and the N voltage boost sub-circuits 201 do not affect each other. Therefore, when a problem occurs in a voltage boost sub-circuit 201, other voltage boost sub-circuits 201 may also normally work, which is advantageous for improving a reliability of the demultiplexer 10.

Figure 4:
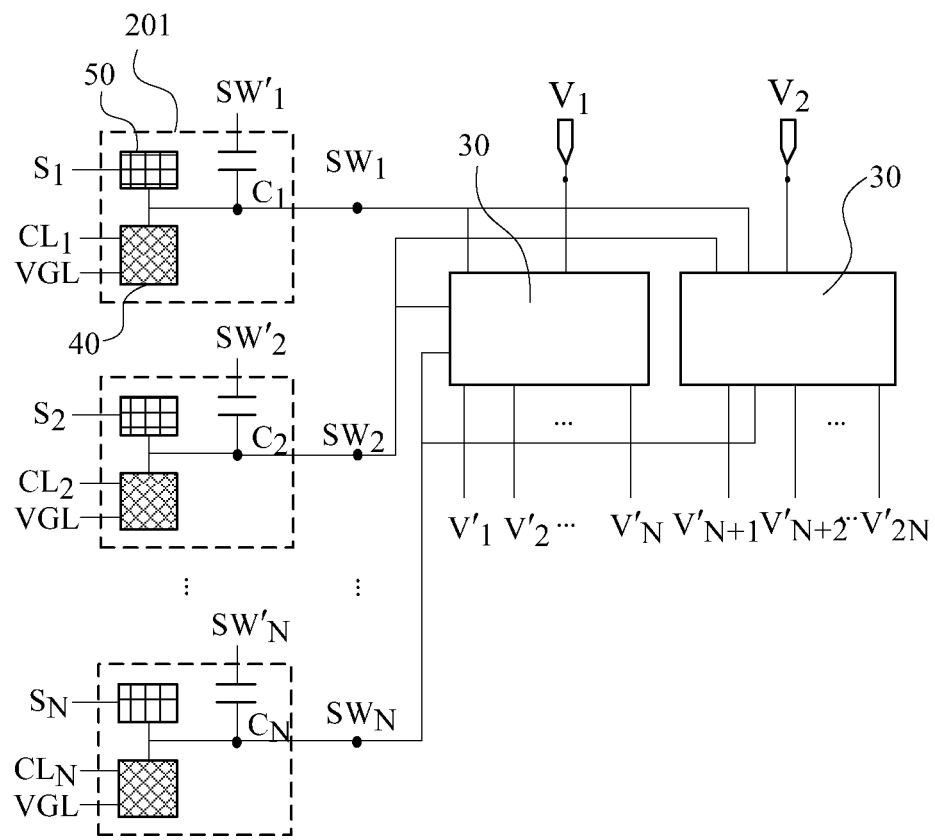
FIG. 4 is a schematic circuit diagram of yet another demultiplexer, in accordance some embodiments of the present disclosure.

In some embodiments, as shown in FIG. 4, each voltage boost sub-circuit 201 includes a coupling capacitor C and a reset module 40. A first electrode of the coupling capacitor C is coupled to a corresponding second-stage selection signal input terminal SW', a second electrode of the coupling capacitor C is coupled to an auxiliary signal input terminal S and a corresponding first-stage selection signal input terminal SW, and the coupling capacitor C is configured to add a voltage input via the auxiliary signal input terminal S to a voltage input via the second-stage selection signal input terminal SW' and output the added voltage to the first-stage selection signal input terminal SW. The reset module 40 is coupled to the first-stage selection signal input terminal SW, a control signal input terminal CL and a first voltage terminal VGL, and the reset module 40 is configured to transmit a voltage signal input via the first voltage terminal VGL to the first-stage selection signal input terminal SW under control of a voltage input via the control signal input terminal CL, so as to reset the voltage on the first-stage selection signal input terminal SW.

For example, the first voltage terminal VGL is a negative voltage terminal or a ground terminal. Further, a plurality of first voltage terminals VGL coupled to a plurality of reset modules 40 are coupled together.

In each voltage boost sub-circuit 201, according to a working principle of the coupling capacitor C, after a voltage is input via the auxiliary signal input terminal S, the voltage input via the auxiliary signal input terminal S will be stored in the second electrode of the coupling capacitor C. When a voltage is input via the second-stage selection signal input terminal SW', the voltage input via the second-stage selection signal input terminal SW' will be added to the voltage stored in the second electrode of the coupling capacitor C, so that a voltage on the second electrode of the coupling capacitor C (that is, a voltage on the first-stage selection signal input terminal SW) is a sum of the voltage input via the auxiliary signal input terminal S and the voltage input via the second-stage selection signal input terminal SW'. In addition, the voltages are not simultaneously input via the auxiliary signal input terminal S and the second-stage selection signal input terminal SW', but the voltage input via the auxiliary signal input terminal S is first stored in the second electrode of the coupling capacitor C, and then, when the voltage is input via the second-stage selection signal input terminal SW' coupled to the coupling capacitor C, the voltage stored in the second electrode of the coupling capacitor C and the voltage input via the second-stage selection signal input terminal SW' are added through the coupling capacitor C.

In some examples, each auxiliary signal input terminal S is configured to input a constant voltage (including a voltage of 0V) or a pulse voltage including a high level signal (for example, a positive level signal) and a low level signal (for example, a negative level signal).

For example, pulse voltages are input via the auxiliary signal input terminals S respectively, and whether or not the level signals of the pulse voltages input via the auxiliary signal input terminal S are valid depends on the type of a plurality of thin film transistors used in the data selection output circuit 30. For example, the thin film transistors in the data selection output circuit 30 are N-type thin film transistors, and the high level signal in the pulse voltage input via each auxiliary signal input terminal S is a valid signal, which is regarded as a voltage input via a corresponding auxiliary signal input terminal S. For another example, the thin film transistors in the data selection output circuit 30 are P-type thin film transistors, and the low level signal in the pulse voltage input via each auxiliary signal input terminal S is a valid signal, which is regarded as a voltage input via a corresponding auxiliary signal input terminal S.

In addition, in some examples, each first-stage selection signal input terminal SW, each second-stage selection signal input terminal SW' and each auxiliary signal input terminal S are configured to input a pulse voltage, high level signals will be input via the first-stage selection signal input terminal SW, the second-stage selection signal input terminal SW' and the auxiliary signal input terminal S, which all correspond to a same voltage boost sub-circuit 201, respectively, or low level signals will be input via the first-stage selection signal input terminal SW, the second-stage selection signal input terminal SW' and the auxiliary signal input terminal S, which all correspond to a same voltage boost sub-circuit 201, respectively.

Figure 6:
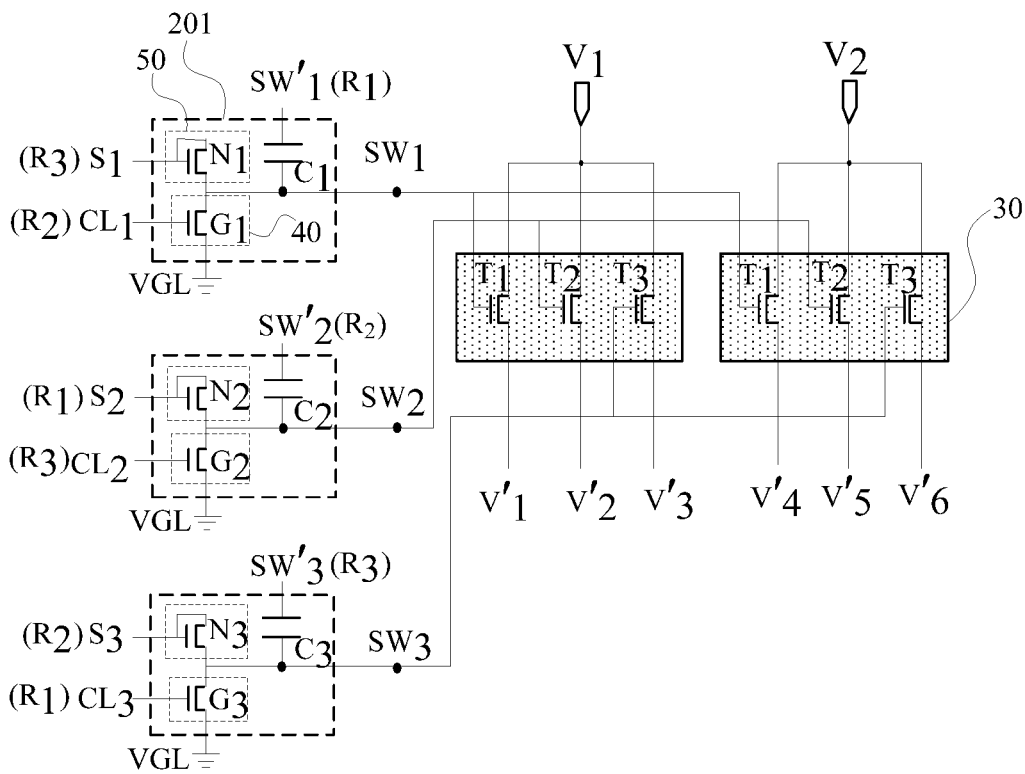
FIG. 6 is a schematic circuit diagram of yet another demultiplexer, in accordance some embodiments of the present disclosure.

In some embodiments, with reference to FIGS. 4 and 6 (FIG. 6 shows an example in which N is equal to three), the reset module 40 in each voltage boosting sub-circuit 201 includes a first thin film transistor G. A control electrode of the first thin film transistor G is coupled to the control signal input terminal CL, a first electrode of the first thin film transistor G is coupled to the first-stage selection signal input terminal SW, and a second electrode of the first thin film transistor G is coupled to the first voltage terminal VGL. In each voltage boost sub-circuit 201, when the voltage input via the control signal input terminal CL controls the first thin film transistor G to be turned on, the voltage input via the first voltage terminal VGL is transmitted to a corresponding first-stage selection signal input terminal SW through the first thin film transistor G, so as to reset a voltage on the first-stage selection signal input terminal SW.

Here, the control electrode of the first thin film transistor G is a gate. Some embodiments of the present disclosure do not limit the first electrode and the second electrode of the first thin film transistor G. In some examples, the first electrode of the first thin film transistor G is a source, and the second electrode of the first thin film transistor G is a drain. In some other examples, the first electrode of the first thin film transistor G is a drain, and the second electrode of the first thin film transistor G is a source.

Further, the first thin film transistor G is an N-type thin film transistor or a P-type thin film transistor.

In some examples, each reset module 40 further includes a plurality of switching transistors in parallel with the first thin film transistor G.

The above is only an example of the reset module 40, and other structures having same functions as the reset module 40 are not described herein again, but all should be included in the protection scope of the present disclosure.

In some embodiments, with continued reference to FIGS. 4 and 6 (FIG. 6 shows an example N is equal to three), each voltage boost sub-circuit 201 further includes an input module 50 coupled to both the auxiliary signal input terminal S and the coupling capacitor C. The input module 50 is configured to transmit the voltage input via the auxiliary signal input terminal S to the second electrode of the coupling capacitor C (or, the first-stage selection signal input terminal SW).

Some embodiments of the present disclosure do not limit a structure of the input module 50, as long as the voltage input via the auxiliary signal input terminal S may be transmitted to the second electrode of the coupling capacitor C (or, the first-stage selection signal input terminal SW).

For example, as shown in FIG. 6, the input module 50 includes a second thin film transistor N. A control electrode and a first electrode of the second thin film transistor N are coupled to the auxiliary signal input terminal S, and a second electrode of the second thin film transistor N is coupled to the second electrode of the coupling capacitor C (or, the first-stage selection signal input terminal SW).

Here, the control electrode of the second thin film transistor N is a gate. Some embodiments of the present disclosure do not limit the first electrode and the second electrode of the second thin film transistor N. In some examples, the first electrode of the second thin film transistor N is a source, and the second electrode of the second thin film transistor N is a drain. In some other examples, the first electrode of the second thin film transistor N is a drain, and the second electrode of the second thin film transistor N is a source.

Further, the second thin film transistor N is an N-type thin film transistor or a P-type thin film transistor.

In some examples, each input module 50 further includes a plurality of switching transistors in parallel with the second thin film transistor N.

The above is only an example of the input module 50, and other structures having the same functions as the input module 50 are not described herein again, but all should belong to the protection scope of the present disclosure.

In some embodiments, signals are respectively input via different signal lines to control signal input terminals CL, second-stage selection signal input terminals SW' and auxiliary signal input terminals S which are all coupled to the voltage boost sub-circuit 201s. Of course, on a premise of not affecting normal operations of the voltage boost sub-circuits 201, the control signal input terminals CL, the second-stage selection signal input terminal SW' and the auxiliary signal input terminals S may share a part of signal lines, thereby reducing the total number of the signal lines, and then simplifying a structure of the demultiplexer 10.

With reference to FIG. 6, letters in parentheses next to each control signal input terminal CL, each second-stage selection signal input terminal SW' and each auxiliary signal input terminal S indicate names of corresponding signal lines.

For example, a control signal input terminal CL coupled to a reset module 40 in a voltage boost sub-circuit 201 is coupled to a second-stage selection signal input terminal SW' coupled to a coupling capacitor C in a latter voltage boost sub-circuit 201.

That is, a (K−1)th control signal input terminal $CL_{K-1}$ is coupled to a Kth second-stage selection signal input terminal $SW'_K$. The (K−1)th control signal input terminal $CL_{K-1}$ is a control signal input terminal $CL_{K-1}$ coupled to a reset module 40 in the (K−1)th voltage boost sub-circuit 201. The Kth second-stage selection signal input terminal $SW'_K$ is a second-stage selection signal input terminal $SW'_K$ coupled to a coupling capacitor $C_K$ in the Kth voltage boost sub-circuit. That is, the (K−1)th control signal input terminal $CL_{K-1}$ and the Kth second-stage selection signal input terminal $SW'_K$ may share a single signal line $R_K$.

In some examples, the N voltage boost sub-circuits 201 cyclically work, an Nth control signal input terminal $CL_N$ is coupled to the first second-stage selection signal input terminal $SW'_1$. The Nth control signal input terminal $CL_N$ is a control signal input terminal $CL_N$ coupled to a reset module 40 in the Nth voltage boost sub-circuit 201. The first second-stage selection signal input terminal $SW'_1$ is a second-stage selection signal input terminal $SW'_1$ coupled to a coupling capacitor $C_1$ in the first voltage boost sub-circuit 201. That is, the Nth control signal input terminal $CL_N$ and the first second-stage selection signal input terminal $SW'_1$ may share a single signal line $R_1$.

On this basis, two adjacent voltage boost sub-circuits 201 may be controlled to simultaneously perform different operations by using a single signal line to simultaneously output signals to the control signal input terminal CL and the second-stage selection signal input terminal SW' coupled thereto. That is, a voltage boost sub-circuit 201 resets a voltage on a corresponding first-stage selection signal input terminal SW under the control of the signal from the control signal input terminal CL. At the same time, a latter voltage boost sub-circuit 201 boosts a voltage of the signal input via the second-stage selection signal input terminal SW' and then outputs the boosted voltage to a corresponding first-stage selection signal input terminal SW. Therefore, at least two voltage boost sub-circuits 201 in the demultiplexer 10 may simultaneously work, which is advantageous for improving a working efficiency of the demultiplexer 10.

In some examples, each voltage boost sub-circuit 201 includes the input module 50, and an auxiliary signal input terminal S coupled to an input module 50 in a voltage boost sub-circuit 201 is coupled to a second-stage selection signal input terminal SW' coupled to a coupling capacitor C in a previous voltage boost sub-circuit 201.

That is, the (K−1)th second-stage selection signal input terminal $SW'_{K-1}$ is coupled to a Kth auxiliary signal input terminal $S_K$. The (K−1)th second-stage selection signal input terminal $SW'_{K-1}$ is a second-stage selection signal input terminal $SW'_{K-1}$ coupled to a coupling capacitor $C_{K-1}$ in the (K−1)th voltage boost sub-circuit 201. The Kth auxiliary signal input terminal $S_K$ is an auxiliary signal input terminal $S_K$ coupled to an input module 50 in the Kth voltage boost sub-circuit 201. That is, the (K−1)th second-stage selection signal input terminal $SW'_{K-1}$ and the Kth auxiliary signal input terminal $S_K$ may share a single signal line $R_{K-1}$.

In some examples, the N voltage boost sub-circuits 201 cyclically work, and the Nth second-stage selection signal input terminal $SW'_N$ is coupled to a first auxiliary signal input terminal $S_1$. The Nth second-stage selection signal input terminal $SW'_N$ is a second-stage selection signal input terminal $SW'_N$ coupled to a coupling capacitor $C_N$ in the Nth voltage boost sub-circuit 201. The first auxiliary signal input terminal $S_1$ is an auxiliary signal input terminal $S_1$ coupled to an input module 50 in the first voltage boost sub-circuit 201. That is, the Nth second-stage selection signal input terminal $SW'_N$ and the first auxiliary signal input terminal $S_1$ may share a single signal line $R_N$.

On this basis, two adjacent voltage boost sub-circuits 201 may be controlled to simultaneously perform different operations by using a single signal line to simultaneously output signals to the second-stage selection signal input terminal SW' and the auxiliary signal input terminal S coupled thereto. That is, a coupling capacitor C in a voltage boost sub-circuit 201 boosts a voltage input via the second-stage selection signal input terminal SW'. At the same time, a voltage input via the auxiliary signal input terminal S is stored in a second electrode of a coupling capacitor C in a latter voltage boost sub-circuit 201. Therefore, at least two voltage boost sub-circuits 201 in the demultiplexer 10 may simultaneously work, which is advantageous for improving the working efficiency of the demultiplexer 10.

Figure 5:
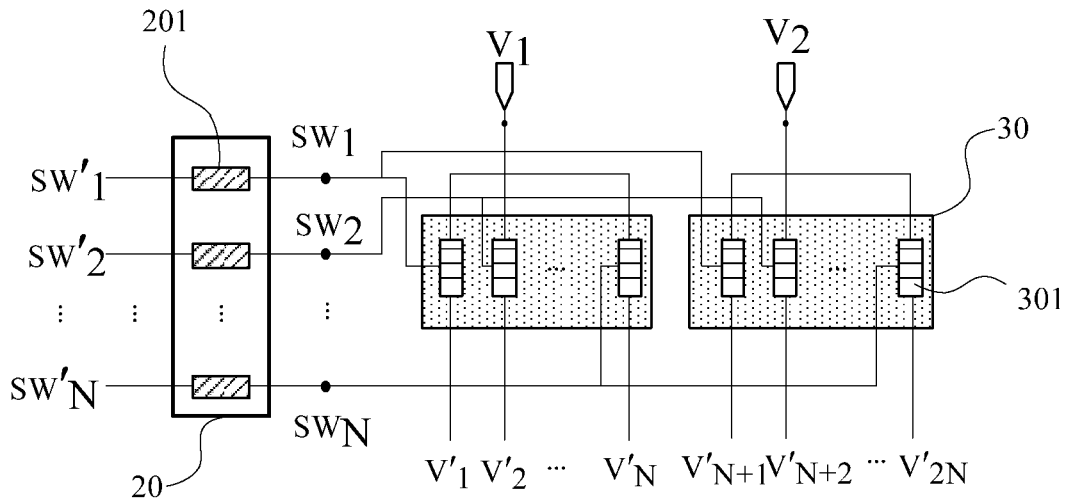
FIG. 5 is a schematic circuit diagram of yet another demultiplexer, in accordance some embodiments of the present disclosure.

In some embodiments, with reference to FIGS. 5 and 6, each data selection output circuit 30 includes N control switches 301 electrically connected to a corresponding data input terminal V. Each control switch 301 is coupled to a first-stage selection signal input terminal SW and a data output terminal V'. Each control switch 301 is configured to transmit a data signal from a corresponding data input terminal V to a data output terminal V' coupled thereto under control of a first-stage selection signal input terminal SW coupled thereto. In each data selection output circuit 30, the N control switches 301 are successively turned on, and the data signals from the corresponding data input terminal V may be successively input to the N data output terminals V'.

Some embodiments of the present disclosure do not limit a structure of the control switches 301. For example, with reference to FIG. 6, each control switch 301 includes a third thin film transistor T. A control electrode of the third thin film transistor T is coupled to a corresponding first-stage selection signal input terminal SW, a first electrode of the third thin film transistor T is coupled to a corresponding data input terminal V, and a second electrode of the third thin film transistor T is coupled to a corresponding data output terminal V'.

Here, the control electrode of the third thin film transistor T is a gate. Some embodiments of the present disclosure do not limit the first electrode and the second electrode of the third thin film transistor T. In some examples, the first electrode of the third thin film transistor T is a source, and the second electrode of the third thin film transistor T is a drain. In some other examples, the first electrode of the third thin film transistor T is a drain, and the second electrode of the third thin film transistor T is a source.

In some examples, each control switch 301 further includes a plurality of switching transistors in parallel with the third thin film transistor T.

The above is only an example of the control switch 301, and other structures having the same functions as the control switch 301 are not described herein again, but all should belong to the protection scope of the present disclosure.

In some examples, the third thin film transistor T is an N-type thin film transistor. Since the higher a gate voltage of the N-type thin film transistor, the larger a charging capability of the N-type thin film transistor, the design that gate circuits composed of N-type thin film transistors are disposed in the data selection output circuit 30 may effectively improve the charging capabilities of the N-type thin film transistors in a case where voltages input via corresponding first-stage selection signal input terminals SW have been boosted, so as to ensure that the values of the data voltages transmitted to the corresponding data lines from each data input terminal V through the demultiplexer 10 have a larger range and a higher accuracy.

In some embodiments, the third thin film transistor T is selected from a group consisting of an amorphous silicon thin film transistor, an oxide thin film transistor and a low-temperature polysilicon thin film transistor.

Figure 7A:
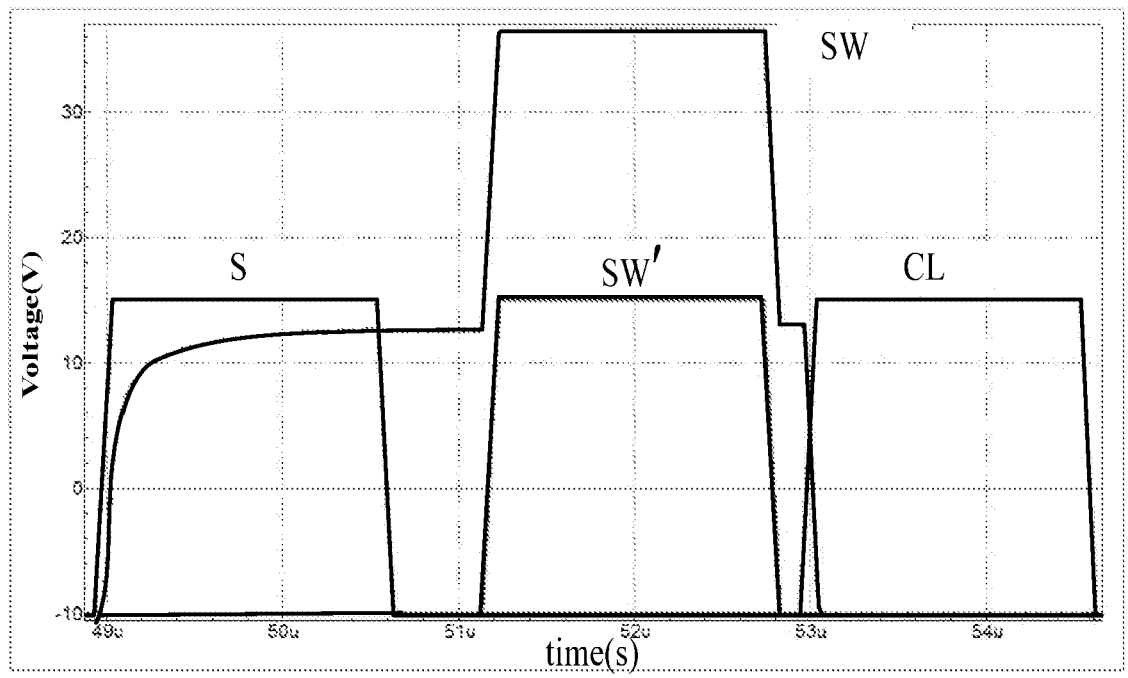
FIG. 7A is a schematic diagram showing a simulation result of a demultiplexer, in accordance some embodiments of the present disclosure.
Figure 7B:
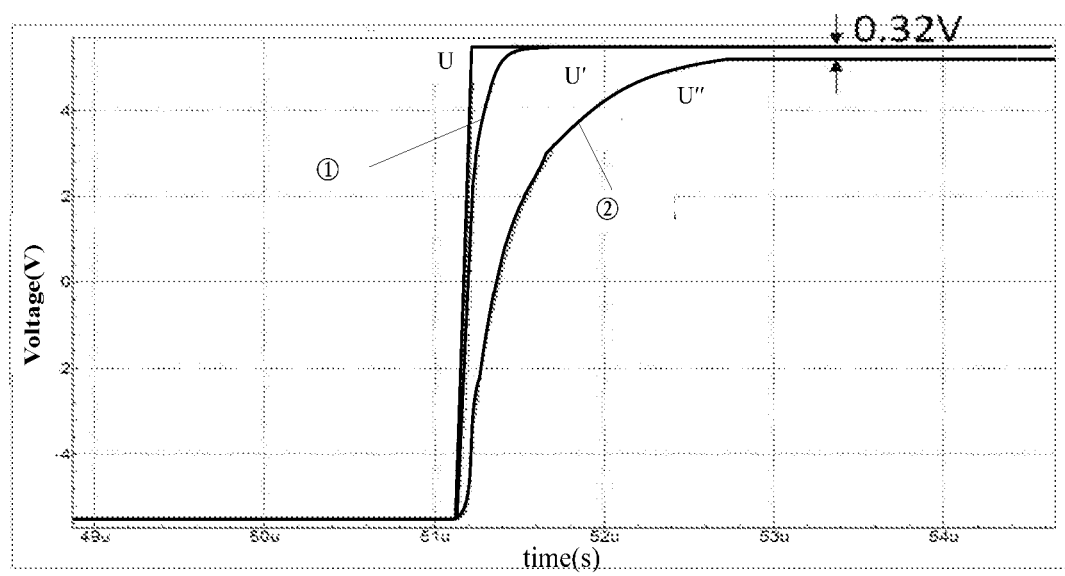
FIG. 7B is a schematic diagram showing a simulation result of another demultiplexer, in accordance some embodiments of the present disclosure.
Figure 8:
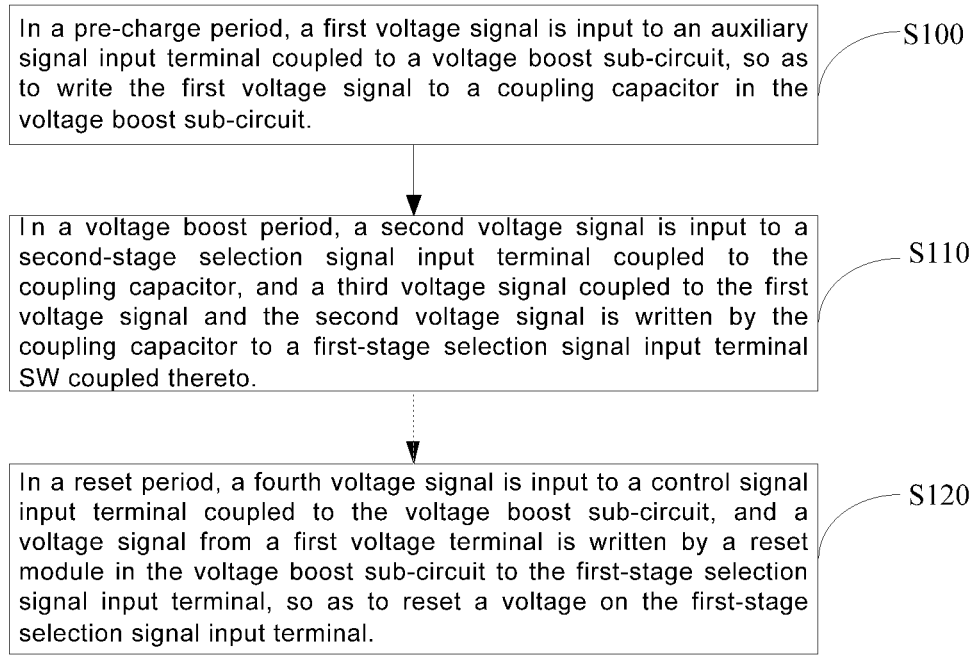
FIG. 8 is a flow diagram of a method of controlling a demultiplexer, in accordance some embodiments of the present disclosure.

FIGS. 7A and 7B show results of performing data simulations on the above demultiplexer 10, in accordance with some embodiments.

With reference to FIG. 7A, in a process of successively inputting voltages to an auxiliary signal input terminal S, a second-stage selection signal input terminal SW' and a control signal input terminal CL coupled to a voltage boost sub-circuit 201, a voltage on a first-stage selection signal input terminal SW coupled to the voltage boost sub-circuit 201 will be effectively boosted when the voltage is input to the second-stage selection signal input terminal SW'.

With reference to FIG. 7B, in a process of inputting a voltage U by using a data input terminal V, if the demultiplexer 10 (shown in FIG. 1) in the related art is used for voltage distribution, an output voltage U''' output by the demultiplexer 10 to a data output terminal V', as shown by the curve ②, is less than the voltage U input via the data input terminal V. If the demultiplexer 10 provided by the embodiments of the present disclosure is used for voltage distribution, an output voltage U' output by the demultiplexer 10 to a data output terminal V', as shown by the curve ①, is equal to or approximately equal to the voltage U input via the data input terminal V. For example, the voltage U input via the data input terminal V is 4.8V, and the voltage U' output by the demultiplexer 10 provided by the embodiments of the present disclosure is 0.32 V higher than the voltage U''' output by the demultiplexer 10 in the related art.

As will be seen from the above, in the demultiplexer 10 provided by the embodiments of the present disclosure, a data output capability of each data selection output circuit 30 may be improved after effectively boosting the voltage input via a corresponding first-stage selection signal input terminals SW, thereby ensuring that the values of the data voltages transmitted to the corresponding data lines from each data input terminal V through the demultiplexer 10 have a larger range and a higher accuracy.

Figure 11:
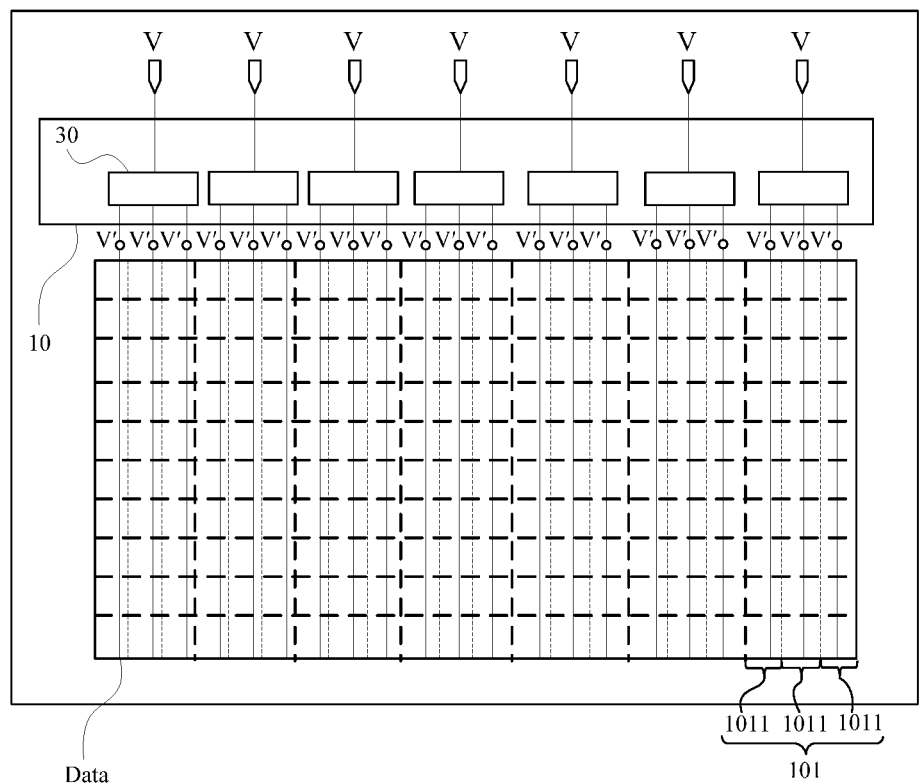
FIG. 11 is a schematic diagram of a display device, in accordance some embodiments of the present disclosure.

Some embodiments of the present disclosure provide a display device. With reference to FIG. 11, the display device 100 includes a plurality of data lines Data and the demultiplexer 10 described above. A data output terminal V' of the demultiplexer 10 is coupled to a data line Data. Thus, when a data selection output circuit 30 in the demultiplexer 10 is coupled to N data output terminals V', the demultiplexer 10 may successively output data voltages on a data input terminal V to N data lines Data.

Some embodiments of the present disclosure do not limit a type of the display device. For example, the display device is a liquid crystal display (abbreviated as LCD) device or an organic light-emitting diode (abbreviated as OLED) display device.

In some embodiments, the display device is configured to display dynamic contents (e.g., videos) or stationary contents (e.g., stationary images), and the contents are texts or pictures. For example, it is expected that the embodiments described above may be implemented in or associated with a variety of electronic devices. The variety of electronic devices includes, for example (but not limit to), mobile telephones, wireless devices, personal data assistants (PDAs), hand-held or portable computers, global positioning system (GPS) receivers/navigators, cameras, MP4 video players, video cameras, game consoles, watches, clocks, calculators, TV monitors, flat panel displays, computer monitors, car displays (such as odometer display etc.), navigators, cockpit controllers and/or displays, camera view displays (such as rear view camera display in a vehicle), electronic photos, electronic billboards or signages, projectors, building structures, packagings and aesthetic structures (such as a display for an image of a piece of jewelry) etc. In addition, the display device provided by some embodiments of the present disclosure is a display panel.

In the embodiments, the demultiplexer 10 is disposed in the display device 100, which may reduce a total number of data input terminals V by using the demultiplexer 10, thereby achieving a narrow bezel of the display device. In addition, beneficial effects of the demultiplexer 10 in the display device in the embodiments of the present disclosure are the same as technical effects of the demultiplexer 10 in the embodiments described above, which are not described herein again.

In some embodiments, with reference to FIG. 11, the display device 100 further includes a plurality of pixels 101 arranged in an array, and each pixel 101 includes N sub-pixels 1011. Each pixel 101 corresponds to a data selection output circuit 30 in the demultiplexer 10, and N sub-pixels 1011 in each pixel 101 are coupled to a corresponding data selection output circuit 30 through the N data lines Data coupled one-to-one to the data output terminals V'. Thus, data signals may be successively supplied to the sub-pixels 1011 in a pixel 101 through a data input terminal V.

Some embodiments of the present disclosure do not limit the number of sub-pixels 1011 in each pixel 101. In some examples, each pixel 101 includes three sub-pixels 1011, which are a red sub-pixel (R), a green sub-pixel (G) and a blue sub-pixel (B), respectively. In some other examples, each pixel 101 includes four sub-pixels 1011, which are a red sub-pixel (R), a green sub-pixel (G), a blue sub-pixel (B) and a white sub-pixel (W), respectively.

Some embodiments of the present disclosure provide a method of controlling the demultiplexer in some embodiments described above. With reference to FIGS. 2-6 and 8-10, the method of controlling the demultiplexer includes S100 to S120.

In S100, in a pre-charge period $T_{10}$, a first voltage signal is input to an auxiliary signal input terminal S coupled to a voltage boost sub-circuit 201, so as to write the first voltage signal to a coupling capacitor C in the voltage boost sub-circuit 201.

In S110, in a voltage boost period $T_{20}$, a second voltage signal is input to a second-stage selection signal input terminal SW' coupled to the coupling capacitor C, and a third voltage signal obtained by adding the first voltage signal to the second voltage signal by the coupling capacitor C is written to a first-stage selection signal input terminal SW coupled to the coupling capacitor C.

In some examples, in the voltage boost period $T_{20}$, under control of the first-stage selection signal input terminal SW, data selection output circuits 30 coupled to the voltage boost sub-circuit 201 transmit data signals from data input terminals V to data output terminals V' respectively.

In some other examples, in the pre-charge period $T_{10}$, under the control of the first-stage selection signal input terminal SW, the data selection output circuits 30 coupled to the voltage boost sub-circuit 201 start to transmit the data signals from the data input terminals V to the data output terminals V' respectively.

In S120, in a reset period $T_{30}$, a fourth voltage signal is input to a control signal input terminal CL coupled to the voltage boost sub-circuit 201, and a voltage signal from a first voltage terminal VGL is written by a reset module 40 in the voltage boost sub-circuit 201 under control of the fourth voltage signal to the first-stage selection signal input terminal SW, so as to reset a voltage on the first-stage selection signal input terminal SW.

The method of controlling the demultiplexer 10 described above is illustrated by taking any voltage boost sub-circuit 201 in the demultiplexer 10 as an example. That is, each voltage boost sub-circuit 201 in the demultiplexer 10 works in accordance with S100 to S120 described above.

A working process of a voltage boost sub-circuit 201 in the demultiplexer 10 during one frame time will be described below by taking the demultiplexer 10 shown in FIG. 6 as an example and in combination with control signals of the signal terminals shown in FIG. 9.

Figure 9:
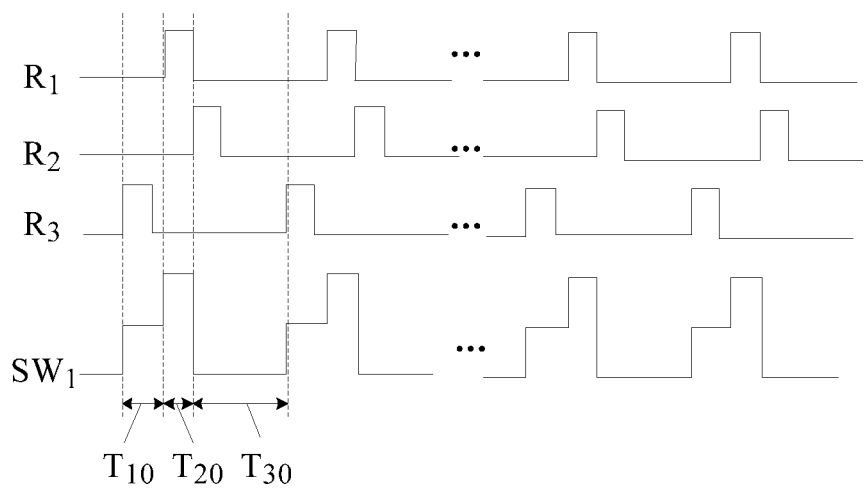
FIG. 9 shows a timing diagram of controlling a demultiplexer, in accordance some embodiments of the present disclosure.

With reference to FIGS. 6 and 9, a first voltage boost sub-circuit 201 coupled to a first first-stage selection signal input terminal $SW_1$ is taken as an example. A reset module 40 in the first voltage boost sub-circuit 201 is a first thin film transistor $G_1$, an input module 50 in the first voltage boost sub-circuit 201 is a second thin film transistor $N_1$, and the first thin film transistor $G_1$ and the second thin film transistor $N_1$ are both N-type thin film transistors.

In the pre-charge period $T_{10}$, a first voltage signal is input to the auxiliary signal input terminal $S_1$ by using a third signal line $R_3$. The first voltage signal is a signal in a high level VGH and the second thin film transistor $N_1$ is turned on under the control of the first voltage signal. The second thin film transistor $N_1$ writes the first voltage signal to a coupling capacitor $C_1$ such that a second electrode of the coupling capacitor $C_1$ (or, the first first-stage selection signal input terminal $SW_1$) is at a high level VGH, and a pre-storage of the data signal of the data input terminal V is performed.

In the voltage boost period $T_{20}$, a second voltage signal is input to a first second-stage selection signal input terminal $SW'_1$ by using a first signal line $R_1$, and the coupling capacitor $C_1$ writes a third voltage signal obtained by adding the first voltage signal to the second voltage signal to the first first-stage selection signal input terminal $SW_1$. If the first voltage signal and the second voltage signal are both signals in a high level VGH, the third voltage signal is in a level 2VGH (that is, a product of 2 and the high level VGH). That is, the first first-stage selection signal input terminal $SW_1$ is at a level 2VGH.

In addition, in the voltage boost period $T_{20}$, the thin film transistors $T_1$ in the data selection output circuits 30 transmit the data signals from the data input terminals V to corresponding data output terminals V' (for example, V'1 and V'4 in FIG. 6) respectively under control of the first first-stage selection signal input terminal $SW_1$.

In the reset period $T_{30}$, the first voltage terminal VGL is grounded. A fourth voltage signal is input to a control signal input terminal $CL_1$ by using a second signal line $R_2$. The fourth voltage signal is a signal in a high level VGH and the first thin film transistor $G_1$ is turned on under the control of the fourth voltage signal. The first thin film transistor $G_1$ writes a voltage signal from the first voltage terminal VGL to the first first-stage selection signal input terminal $SW_1$, so as to reset the voltage on the first first-stage selection signal input terminal $SW_1$.

Here, as shown in FIG. 9, signals are periodically and successively input via the auxiliary signal input terminal S, the second-stage selection signal input terminal SW' and the control signal input terminal CL coupled to each voltage boost sub-circuit 201, so as to repeat the pre-charge period $T_{10}$, the voltage boost period $T_{20}$ and the reset period $T_{30}$ described above.

Figure 10:
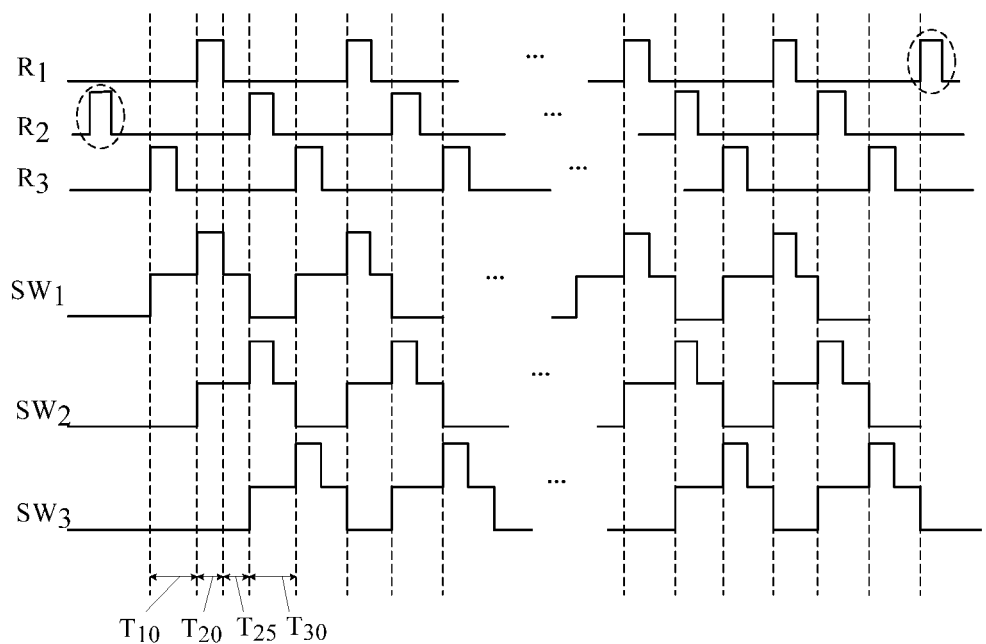
FIG. 10 shows a timing diagram of controlling another demultiplexer, in accordance with some embodiments of the present disclosure.

In addition, before the first voltage boost sub-circuit 201 starts working, a dummy signal is input to the control signal input terminal $CL_1$ coupled thereto as a turn-on (STV) signal, for example, a high level signal input by using the second signal line $R_2$ in the dotted circle in FIG. 10, thereby controlling the voltage boost sub-circuits 201 in the voltage boost circuit 20 to successively start working. Of course, after a last voltage boost sub-circuit 201 finishes working, a dummy signal is input to the control signal input terminal CL coupled thereto as a reset signal, for example, a high level signal input by using the first signal line $R_1$ in the dotted circle in FIG. 10, thereby controlling the voltage boost sub-circuits 201 in the voltage boost circuit 20 to finish working.

In some embodiments, as shown in FIG. 10, the method of controlling the demultiplexer 10 further includes: in a pre-reset period $T_{25}$, stopping inputting the second voltage signal to the second-stage selection signal input terminal, wherein the pre-reset period $T_{25}$ is after the voltage boost period $T_{20}$ and before the reset period $T_{30}$.

With reference to FIGS. 6 and 10, the first voltage boost sub-circuit 201 coupled to the first first-stage selection signal input terminal $SW_1$ is taken as an example. In the pre-reset period $T_{25}$, an input of the second voltage signal to the first second-stage selection signal input terminal $SW'_1$ is stopped. That is, the first signal line $R_1$ is controlled to stop inputting the second voltage signal. In this case, the voltage on the first first-stage selection signal input terminal $SW_1$ is lowered and then is maintained at a voltage input to the auxiliary signal input terminal $S_1$ through the third signal line $R_3$ in the pre-charge period $T_{10}$. After entering the reset phase $T_{30}$, that is, after inputting the fourth voltage signal to the control signal input terminal $CL_1$ through the third signal line $R_3$, the reset module 40 writes the voltage signal from the first voltage terminal VGL to the first first-stage selection signal input terminal $SW_1$, so as to reset the voltage on the first first-stage selection signal input terminal $SW_1$.

In the above embodiments, the pre-reset period $T_{25}$ is set between the voltage boost period $T_{20}$ and the reset period $T_{30}$, which may control the voltage on each first-stage selection signal input terminal SW to be gradually lowered, so that a voltage transmitted to data output terminal V' from the data input terminal V is maintained for a period of time and then lowered, which is advantageous for improving a data output capability of each data selection output circuit 30 in the demultiplexer 10.

In some embodiments, the first voltage signals are cyclically input via N auxiliary signal input terminals coupled to N voltage boost sub-circuits, and working processes of the N voltage boost sub-circuits 201 do not affect each other. With continued reference to FIG. 10, when a previous voltage boost sub-circuit 201 is at a beginning of the voltage boost period $T_{20}$, a current voltage boost sub-circuit 201 is at a beginning of the pre-charge period $T_{10}$. When the previous voltage boost sub-circuit 201 is at a beginning of the reset period $T_{30}$, the current voltage boost sub-circuit 201 is at the beginning of the voltage boost period $T_{20}$.

A mutual relationship among the voltage boost sub-circuits 201 in the demultiplexer 10 during operation will be described below by taking the demultiplexer 10 shown in FIG. 6 as an example and in combination with control signals of the signal terminals shown in FIG. 10.

With reference to FIGS. 6 and 10, a voltage boost sub-circuit 201 coupled to the first first-stage selection signal input terminal SW, is a first voltage boost sub-circuit 201, a voltage boost sub-circuit 201 coupled to a second first-stage selection signal input terminal $SW_2$ is a second voltage boost sub-circuit 201, and a voltage boost sub-circuit 201 coupled to a third first-stage selection signal input terminal $SW_3$ is a third voltage boost sub-circuit 201.

The second signal line $R_2$ is used to input a turn-on signal to the control signal input terminal CL, coupled to the first voltage boost sub-circuit 201 to control the first voltage boost sub-circuit 201 to start working. Then, the third signal line $R_3$ is used to input the first voltage signal to the auxiliary signal input terminal $S_1$ coupled to the first voltage boost sub-circuit 201, which means that the first voltage boost sub-circuit 201 enters the pre-charge period $T_{10}$.

Then, the first signal line $R_1$ is used to input the second voltage signal to the second-stage selection signal input terminal SW', coupled to the first voltage boost sub-circuit 201, which means that the first voltage boost sub-circuit 201 enters the voltage boost period $T_{20}$ (that is, the first voltage boost sub-circuit 201 is at the beginning of the voltage boost period $T_{20}$). In the meantime, the first signal line $R_1$ is used to input the first voltage signal to the auxiliary signal input terminal $S_2$ coupled to the second voltage boost sub-circuit 201, which means that the second voltage boost sub-circuit 201 enters the pre-charge period $T_{10}$ (that is, the second voltage boost sub-circuit 201 is at the beginning of the pre-charge period $T_{10}$).

Then, the second signal line $R_2$ is used to input the fourth voltage signal to the control signal input terminal $CL_1$ coupled to the first voltage boost sub-circuit 201, which means that the first voltage boost sub-circuit 201 enters the reset period $T_{30}$ (that is, the first voltage boost sub-circuit 201 is at the beginning of the reset period $T_{30}$). In the meantime, the second signal line $R_2$ is used to input the second voltage signal to the second-stage selection signal input terminal $SW'_2$ coupled to the second voltage boost sub-circuit 201, which means that the second voltage boost sub-circuit 201 enters the voltage boost period $T_{20}$ (that is, the second voltage boost sub-circuit 201 is at the beginning of the voltage boost period $T_{20}$). In the meantime, the second signal line $R_2$ is used to input the first voltage signal to the auxiliary signal input terminal $S_3$ coupled to the third voltage boost sub-circuit 201, which means that the second voltage boost sub-circuit 201 enters the pre-charge period $T_{10}$ (that is, the second voltage boost sub-circuit 201 is at the beginning of the pre-charge period $T_{10}$).

Then, the third signal line $R_3$ is used to input the fourth voltage signal to a control signal input terminal $CL_2$ coupled to the second voltage boost sub-circuit 201, which means that the second voltage boost sub-circuit 201 enters the reset period $T_{30}$ (that is, the second voltage boost sub-circuit 201 is at the beginning of the reset period $T_{30}$). In the meantime, the third signal line $R_3$ is used to input the second voltage signal to a second-stage selection signal input terminal $SW'_3$ coupled to the third voltage boost sub-circuit 201, which means that the third voltage boost sub-circuit 201 enters the voltage boost period $T_{20}$ (that is, the third voltage boost sub-circuit 201 is at the beginning of the voltage boost period $T_{20}$).

Since the first voltage boost sub-circuit 201, the second voltage boost sub-circuit 201 and the third voltage boost sub-circuit 201 cyclically work, when the third voltage boost sub-circuit 201 enters the voltage boost period $T_{20}$ (that is, the third voltage boost sub-circuit 201 is at the beginning of the voltage boost period $T_{20}$), the first voltage signal is input to the auxiliary signal input terminal $S_1$ coupled to the first voltage boost sub-circuit 201 by using the third signal line $R_3$, which means that the first voltage boost sub-circuit 201 enters the pre-charge period $T_{10}$ (that is, the first voltage boost sub-circuit 201 is at the beginning of the pre-charge period $T_{10}$). Similarly, the first voltage boost sub-circuit 201, the second voltage boost sub-circuit 201 and the third voltage boost sub-circuit 201 cyclically work.

The method described in some embodiments of the present disclosure may be implemented by means of executing instructions. The instructions may be executed by one or more processors, which may be stored in a random access memory (RAM), a flash memory, a read only memory (ROM), an erasable programmable ROM (EPROM), an electrically EPROM (EEPROM), a register, a hard disk, a mobile hard disk, a compact disc read only memory (CD-ROM) or any other forms of storage media well known in the art.

Some embodiments of the present disclosure provide a non-transitory computer-readable storage medium storing executable instructions. The executable instructions, when executed by a display device, cause the display device to perform the control method according to some embodiments described above.

A person skilled in the art will appreciate that in one or more examples described above, the functions described may be implemented in a hardware, a software, a firmware or any combination thereof. When implemented in a software, the functions may be stored in a computer-readable medium or transmitted as one or a plurality of instructions or code in a computer-readable medium. The computer-readable medium includes a computer storage medium and a communication medium, wherein the communication medium includes any medium convenient for transmitting computer programs from one location to another. The storage medium may be any available medium that may be accessed by a general-purpose or special-purpose computer.

In the above description of the embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A demultiplexer, comprising:
a voltage boost circuit, wherein the voltage boost circuit is coupled to N second-stage selection signal input terminals and N first-stage selection signal input terminals, the N second-stage selection signal input terminals are in one-to-one correspondence with the N first-stage selection signal input terminals, and the voltage boost circuit is configured to successively boost voltages input via the N second-stage selection signal input terminals and output boosted voltages to corresponding first-stage selection signal input terminals, wherein N is greater than or equal to 2, and N is a positive integer; and
at least one data selection output circuit, wherein each data selection output circuit is coupled to a data input terminal, N data output terminals and the N first-stage selection signal input terminals, and the data selection output circuit is configured to successively output data signals from the data input terminal to the N data output terminals under control of the N first-stage selection signal input terminals;
wherein the voltage boost circuit includes N voltage boost sub-circuits, each voltage boost sub-circuit is coupled to a corresponding first-stage selection signal input terminal and a corresponding second-stage selection signal input terminal, and
a (K−1)th voltage boost sub-circuit is further configured to reset a voltage on a (K−1)th first-stage selection signal input terminal when a Kth voltage boost sub-circuit boosts a voltage input via a Kth second-stage selection signal input terminal, K is greater than or equal to 2 and is less than or equal to N, and K is a positive integer; and
each voltage boost sub-circuit includes:
a coupling capacitor, wherein a first electrode of the coupling capacitor is coupled to a corresponding second-stage selection signal input terminal, a second electrode of the coupling capacitor is coupled to an auxiliary signal input terminal and a corresponding first-stage selection signal input terminal, and the coupling capacitor is configured to add a voltage input via the second-stage selection signal input terminal to a voltage input via the auxiliary signal input terminal and output an added voltage to the first-stage selection signal input terminal;
a reset module, wherein the reset module is coupled to the first-stage selection signal input terminal, a control signal input terminal and a first voltage terminal, and the reset module is configured to transmit a voltage signal input via the first voltage terminal to the first-stage selection signal input terminal under control of a voltage input via the control signal input terminal, so as to reset a voltage on the first-stage selection signal input terminal; and an input module, wherein the input module includes a second thin film transistor, a control electrode and a first electrode of the second thin film transistor are coupled to the auxiliary signal input terminal, and a second electrode of the second thin film transistor is coupled to the second electrode of the coupling capacitor, and the input module is configured to transmit the voltage input via the auxiliary signal input terminal to the second electrode of the coupling capacitor.

2. The demultiplexer according to claim 1, wherein the reset module includes a first thin film transistor, a control electrode of the first thin film transistor is coupled to the control signal input terminal, a first electrode of the first thin film transistor is coupled to the first-stage selection signal input terminal, and a second electrode of the first thin film transistor is coupled to the first voltage terminal.

3. The demultiplexer according to claim 1, further comprising control signal input terminals and second-stage selection signal input terminals, wherein a (K−1)th control signal input terminal is coupled to the Kth second-stage selection signal input terminal, wherein the (K−1)th control signal input terminal is a control signal input terminal coupled to a reset module in the (K−1)th voltage boost sub-circuit, and the Kth second-stage selection signal input terminal is a second-stage selection signal input terminal coupled to a coupling capacitor in the Kth voltage boost sub-circuit; and an Nth control signal input terminal is coupled to a first second-stage selection signal input terminal, wherein the Nth control signal input terminal is a control signal input terminal coupled to a reset module in an Nth voltage boost sub-circuit, and the first second-stage selection signal input terminal is a second-stage selection signal input terminal coupled to a coupling capacitor in a first voltage boost sub-circuit.

4. The demultiplexer according to claim 3, wherein each voltage boost sub-circuit further includes an input module coupled to the auxiliary signal input terminal and the coupling capacitor;

the demultiplxer further comprises auxiliary signal input terminals;

a (K−1)th second-stage selection signal input terminal is coupled to a Kth auxiliary signal input terminal, wherein the (K−1)th second-stage selection signal input terminal is a second-stage selection signal input terminal coupled to a coupling capacitor in the (K−1)th voltage boost sub-circuit, and the Kth auxiliary signal input terminal is an auxiliary signal input terminal coupled to an input module in the Kth voltage boost sub-circuit; and an Nth second-stage selection signal input terminal is coupled to a first auxiliary signal input terminal, wherein the Nth second-stage selection signal input terminal is a second-stage selection signal input terminal coupled to a coupling capacitor in the Nth voltage boost sub-circuit, and the first auxiliary signal input terminal is an auxiliary signal input terminal coupled to an input module in the first voltage boost sub-circuit.

5. The demultiplexer according to claim 1, wherein each data selection output circuit includes N control switches electrically connected to the data input terminal, wherein each control switch is coupled to a first-stage selection signal input terminal and a data output terminal; and each control switch is configured to transmit a data signal from the data input terminal to the data output terminal coupled thereto under control of the first-stage selection signal input terminal coupled thereto.

6. The demultiplexer according to claim 5, wherein each control switch includes a third thin film transistor, a control electrode of the third thin film transistor is coupled to a corresponding first-stage selection signal input terminal, a first electrode of the third thin film transistor is coupled to the data input terminal, and a second electrode of the third thin film transistor is coupled to the data output terminal.

7. The demultiplexer according to claim 6, wherein the third thin film transistor is an N-type thin film transistor.

8. A display device, comprising:
a plurality of data lines; and
the demultiplexer according to claim 1, wherein a data output terminal coupled to the demultiplexer is coupled to a data line.

9. The display device according to claim 8, further comprising a plurality of pixels, wherein each pixel includes N sub-pixels; and each pixel corresponds to a data selection output circuit of the demultiplexer, and the N sub-pixels in each pixel are coupled to a corresponding data selection output circuit through N data lines coupled one-to-one to data output terminals.

10. A method of controlling the demultiplexer according to claim 1, the method comprising:

in a pre-charge period, inputting a first voltage signal to the auxiliary signal input terminal coupled to the voltage boost sub-circuit, so as to write the first voltage signal to the coupling capacitor in the voltage boost sub-circuit;

in a voltage boost period, inputting a second voltage signal to the second-stage selection signal input terminal coupled to the coupling capacitor, and writing, by the coupling capacitor, a third voltage signal obtained by adding the first voltage signal to the second voltage signal to a first-stage selection signal input terminal coupled thereto; and in a reset period, inputting a fourth voltage signal to a control signal input terminal coupled to the voltage boost sub-circuit, and writing, by a reset module in the voltage boost sub-circuit, a voltage signal from a first voltage terminal to the first-stage selection signal input terminal under control of the fourth voltage signal, so as to reset a voltage on the first-stage selection signal input terminal.

11. The method according to claim 10, further comprising:

in a pre-reset period, stopping inputting the second voltage signal to the second-stage selection signal input terminal, wherein the pre-reset period is after the voltage boost period and before the reset period.

12. The method according to claim 10, further comprising:

in the voltage boost period, outputting, by data selection output circuits coupled to the voltage boost sub-circuit, data signals from data input terminals to data output terminals respectively under control of the first-stage selection signal input terminal.

13. The method according to claim 10, wherein first voltage signals are cyclically input via N auxiliary signal input terminals coupled to the N voltage boost sub-circuits;

when a previous voltage boost sub-circuit is at a beginning of the voltage boost period, a current voltage boost sub-circuit is at a beginning of the pre-charge period; and when the previous voltage boost sub-circuit is at a beginning of the reset period, the current voltage boost sub-circuit is at the beginning of the voltage boost period.

14. A non-transitory computer-readable storage medium storing executable instructions that, when executed by a display device, cause the display device to perform the method according to claim 10.

* * * * *